United States Patent
Kim

(10) Patent No.: US 10,453,508 B2
(45) Date of Patent: Oct. 22, 2019

(54) SEMICONDUCTOR MEMORY APPARATUS WITH A WRITE VOLTAGE LEVEL DETECTION

(71) Applicant: SK hynix Inc., Icheon-si Gyeonggi-do (KR)

(72) Inventor: Yong Seop Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/694,507

(22) Filed: Sep. 1, 2017

(65) Prior Publication Data

US 2018/0082723 A1  Mar. 22, 2018

(30) Foreign Application Priority Data

Sep. 22, 2016 (KR) .................. 10-2016-0121539

(51) Int. Cl.
   *G11C 7/22* (2006.01)
   *G11C 7/10* (2006.01)
   *G11C 5/14* (2006.01)

(52) U.S. Cl.
   CPC ............... *G11C 7/22* (2013.01); *G11C 7/10* (2013.01); *G11C 7/1093* (2013.01); *G11C 7/1096* (2013.01); *G11C 7/222* (2013.01); *G11C 5/144* (2013.01)

(58) Field of Classification Search
   None
   See application file for complete search history.

(56) References Cited

U.S. PATENT DOCUMENTS

| | | | | |
|---|---|---|---|---|
| 2004/0246808 A1* | 12/2004 | Cho | ...................... | G11C 7/1078 365/230.06 |
| 2006/0007729 A1* | 1/2006 | Cho | ................... | G11C 13/0004 365/163 |
| 2006/0087891 A1* | 4/2006 | Jeong | ...................... | G11C 16/10 365/185.28 |
| 2007/0217253 A1* | 9/2007 | Kim | ................... | G11C 13/0004 365/163 |
| 2008/0068903 A1* | 3/2008 | Park | ................... | G11C 13/0004 365/189.16 |
| 2009/0154221 A1* | 6/2009 | Kim | ......................... | G11C 5/14 365/148 |
| 2010/0235714 A1* | 9/2010 | Toda | ...................... | G06F 11/106 714/763 |
| 2011/0051492 A1* | 3/2011 | Toda | ........................ | G11C 5/025 365/148 |
| 2012/0002464 A1* | 1/2012 | Mae | ................... | G11C 13/0004 365/163 |
| 2012/0051169 A1* | 3/2012 | Lee | .................. | G11C 11/40618 365/222 |

(Continued)

FOREIGN PATENT DOCUMENTS

KR  1020050027348 A  3/2005

*Primary Examiner* — J. H. Hur
(74) *Attorney, Agent, or Firm* — William Park & Associates Ltd.

(57) ABSTRACT

A semiconductor memory apparatus includes a write control circuit suitable for generating a write cancel signal and a rewrite signal in response to a voltage level of a write voltage in a write operation, and a driving circuit suitable for transferring data to a data storage region in response to the write cancel signal and the rewrite signal in the write operation.

10 Claims, 4 Drawing Sheets

(56) References Cited

U.S. PATENT DOCUMENTS

2013/0265837 A1* 10/2013 Kwon .................. G11C 7/22
  365/194
2014/0169068 A1*  6/2014 Lee .................. G11C 13/0064
  365/148

* cited by examiner

SEMICONDUCTOR MEMORY APPARATUS WITH A WRITE VOLTAGE LEVEL DETECTION

CROSS-REFERENCES TO RELATED APPLICATION

The present application claims priority under 35 U.S.C. § 119(a) to Korean application number 10-2016-0121539, filed on Sep. 22, 2016, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

Semiconductor memory apparatuses are configured to store data and output stored data.

As semiconductor memory apparatuses trend toward large capacity and high speed operation, semiconductor memory apparatuses are being developed to normally store a large amount of data through one operation.

SUMMARY

In an embodiment, a semiconductor memory apparatus may include: a write control circuit suitable for generating a write cancel signal and a rewrite signal in response to a voltage level of a write voltage in a write operation; and a driving circuit suitable for transferring data to a data storage region in response to the write cancel signal and the rewrite signal in the write operation.

In an embodiment, a semiconductor memory apparatus may include: a write voltage detection circuit suitable for detecting a voltage level of a write voltage and generating a detection signal; a write control circuit suitable for generating a write cancel signal and a rewrite signal in response to the detection signal; and a driving circuit suitable for driving data when activated in response to a write enable signal, the write cancel signal, and the rewrite signal, and transferring the driven data to a data storage region.

In an embodiment, a semiconductor memory apparatus may include: a plurality of driving circuits suitable for being applied with a write voltage and transferring data to a data storage region; a write voltage detection circuit suitable for detecting a voltage level of the write voltage and generating a detection signal; and a write control circuit suitable for simultaneously activating the plurality of driving circuits or first activating some of the plurality of driving circuits and activating remaining driving circuits after activating the plurality of driving circuits, in response to a write enable signal, a rate control signal, a rate enable signal, and the detection signal.

DETAILED DESCRIPTION

Hereinafter, a semiconductor memory apparatus will be described below with reference to the accompanying drawings through various examples of embodiments.

Figure 1:
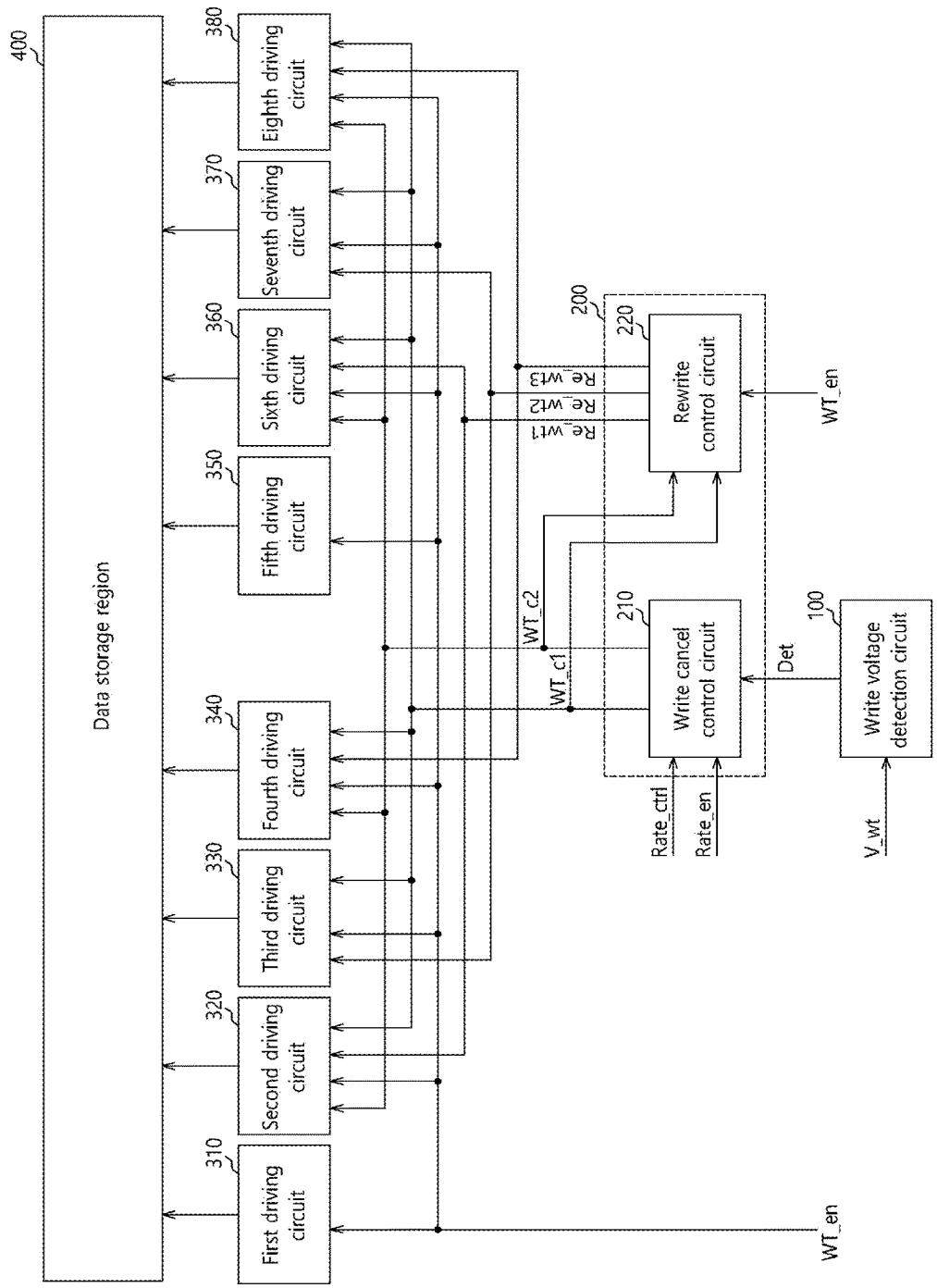
FIG. 1 is a configuration diagram illustrating a representation of an example of a semiconductor memory apparatus in accordance with an embodiment.

As shown in FIG. 1, a semiconductor memory apparatus in accordance with an embodiment may include a write voltage detection circuit 100, a write control circuit 200, first to eighth driving circuits 310, 320, 330, 340, 350, 360, 370 and 380, and a data storage region 400.

The write voltage detection circuit 100 may generate a detection signal Det by detecting, based on a specified level, the voltage level of a write voltage V_wt consumed when data is stored in the semiconductor memory apparatus, that is, in a write operation. For example, the write voltage detection circuit 100 may enable the detection signal Det when the voltage level of the write voltage V_wt becomes lower than a target level. The write voltage V_wt may be a driving voltage which is applied to the first to eighth driving circuits 310, 320, 330, 340, 350, 360, 370 and 380.

The write control circuit 200 may generate a first write cancel signal WT_c1, a second write cancel signal WT_c2, a first rewrite signal Re_wt1, a second rewrite signal Re_wt2, and a third rewrite signal Re_wt3 in response to a rate control signal Rate_ctrl, a rate enable signal Rate_en, the detection signal Det, and a write enable signal WT_en. For example, the write control circuit 200 may enable one of the first and second write cancel signals WT_c1 and WT_c2 in response to the rate control signal Rate_ctrl when the rate enable signal Rate_en is enabled, and generate the first to third rewrite signals Re_wt1, Re_wt2 and Re_wt3 by delaying the write enable signal WT_en. The write enable signal WT_en may be a signal which is enabled in a write operation. The rate enable signal Rate_en and the rate control signal Rate_ctrl may be signals which are inputted from a controller or the output signals of a circuit for setting the circumstances of the semiconductor memory apparatus, that is, a mode register set or a fuse circuit. Further, the write control circuit 200 may generate at least one of the first to third rewrite signals Re_wt1, Re_wt2, and Re_wt3 in response to the detection signal Det. Further yet, the write control circuit 200 may generate at least one rewrite control signal Re_wt1, Re_wt2, and Re_wt3 in response to a voltage level of the write voltage V_wt in a write operation.

The write control circuit 200 may include a write cancel control circuit 210 and a rewrite control circuit 220.

The write cancel control circuit 210 may enable one of the first and second write cancel signals WT_c1 and WT_c2 in response to the rate enable signal Rate_en, the rate control signal Rate_ctrl, and the detection signal Det. For example, the write cancel control circuit 210 may enable one of the first and second write cancel signals WT_c1 and WT_c2 in response to the rate control signal Rate_ctrl when the rate enable signal Rate_en is enabled and the detection signal Det is enabled. In detail, the write cancel control circuit 210 may enable the first write cancel signal WT_c1 when the rate enable signal Rate_en and the detection signal Det are enabled and the rate control signal Rate_ctrl is enabled. The write cancel control circuit 210 may enable the second write cancel signal WT_c2 when the rate enable signal Rate_en and the detection signal Det are enabled and the rate control signal Rate_ctrl is disabled.

The rewrite control circuit 220 may generate the first to third rewrite signals Re_wt1, Re_wt2 and Re_wt3 in response to the first and second write cancel signals WT_c1 and WT_c2 and the write enable signal WT_en. For example, the rewrite control circuit 220 may generate and output the first to third rewrite signals Re_wt1, Re_wt2 and Re_wt3 by selectively delaying the write enable signal WT_en in response to the first and second write cancel signals WT_c1 and WT_c2 being enabled. In detail, the rewrite control circuit 220 may sequentially enable the first to third rewrite signals Re_wt1, Re_wt2 and Re_wt3 after a predetermined time passes from a time of a write operation by delaying the write enable signal WT_en when the first write cancel signal WT_c1 of the first and second write cancel signals WT_c1 and WT_c2 is enabled. In other words, the rewrite control circuit 220 may sequentially enable at least one of the first to third rewrite signals Re_wt1, Re_wt2, and Re_wt3 in response to the first and second write cancel signals WT_c1 and WT_c2 and the write enable signal WT_en. Meanwhile, the rewrite control circuit 220 may simultaneously enable the first and third rewrite signals Re_wt1 and Re_wt3 by delaying the write enable signal WT_en when the second write cancel signal WT_c2 of the first and second write cancel signals WT_c1 and WT_c2 is enabled.

Each of the first and fifth driving circuits 310 and 350 among the first to eighth driving circuits 310, 320, 330, 340, 350, 360, 370 and 380 may be activated in response to the write enable signal WT_en, drive data, and transfer the driven data to the data storage region 400. For example, each of the first and fifth driving circuits 310 and 350 may drive data when the write enable signal WT_en is enabled, and transfer the driven data to the data storage region 400.

Each of the second and sixth driving circuits 320 and 360 among the first to eighth driving circuits 320, 320, 330, 340, 360, 360, 370 and 380 may be activated in response to the write enable signal WT_en, the first and second write cancel signals WT_c1 and WT_c2, and the first rewrite signal Re_wt1. Further, each of the second and sixth driving circuits 320 and 360 may drive data upon activation, and transfer the driven data to the data storage region 400. For example, each of the second and sixth driving circuits 320 and 360 may be activated in response to the write enable signal WT_en and the first rewrite signal Re_wt1, drive data upon activation, and transfer the driven data to the data storage region 400. Each of the second and sixth driving circuits 320 and 360 may be deactivated when the first rewrite signal Re_wt1 is disabled and even one of the first and second write cancel signals WT_c1 and WT_c2 is enabled, and does not perform a driving operation upon deactivation. In detail, each of the second and sixth driving circuits 320 and 360 may be activated when the write enable signal WT_en is enabled in the state in which both the first and second write cancel signals WT_c1 and WT_c2 are disabled. Each of the second and sixth driving circuits 320 and 360 may be deactivated even though the write enable signal WT_en is enabled in the state in which one of the first and second write cancel signals WT_c1 and WT_c2 is enabled in the write operation. Each of the second and sixth driving circuits 320 and 360 may be activated when the first rewrite signal Re_wt1 is enabled even in the state in which one of the first and second write cancel signals WT_c1 and WT_c2 is enabled.

Each of the third and seventh driving circuits 330 and 370 among the first to eighth driving circuits 330, 320, 330, 340, 370, 360, 370 and 380 may drive data in response to the write enable signal WT_en, the first write cancel signal WT_c1, and the second rewrite signal Re_wt2, and transfer the driven data to the data storage region 400. For example, each of the third and seventh driving circuits 330 and 370 may be activated in response to the write enable signal WT_en and the second rewrite signal Re_wt2, drive data upon activation, and transfer the driven data to the data storage region 400. Each of the third and seventh driving circuits 330 and 370 may be deactivated when the first write cancel signal WT_c1 is enabled, and does not perform a driving operation upon deactivation. In detail, each of the third and seventh driving circuits 330 and 370 may be activated when the write enable signal WT_en is enabled in the state in which the first write cancel signal WT_c1 is disabled. Each of the third and seventh driving circuits 330 and 370 may be deactivated even though the write enable signal WT_en is enabled, in the state in which the first write cancel signal WT_c1 is enabled. Each of the third and seventh driving circuits 330 and 370 may be activated when the second rewrite signal Re_wt2 is enabled, even in the state in which the first write cancel signal WT_c1 is enabled.

Each of the fourth and eighth driving circuits 340 and 380 among the first to eighth driving circuits 340, 320, 330, 340, 380, 360, 370 and 380 may be activated in response to the write enable signal WT_en, the first and second write cancel signals WT_c1 and WT_c2 and the third rewrite signal Re_wt3. Further, each of the fourth and eighth driving circuits 340 and 380 may drive data upon activation, and transfer the driven data to the data storage region 400. For example, each of the fourth and eighth driving circuits 340 and 380 may be activated in response to each of the write enable signal WT_en and the third rewrite signal Re_wt3, drive data upon activation, and transfer the driven data to the data storage region 400. Each of the fourth and eighth driving circuits 340 and 380 may be deactivated when the third rewrite signal Re_wt3 is disabled and even one of the first and second write cancel signals WT_c1 and WT_c2 is enabled, and does not perform a driving operation upon deactivation. In detail, each of the fourth and eighth driving circuits 340 and 380 may be activated when the write enable signal WT_en is enabled in the state in which both the first and second write cancel signals WT_c1 and WT_c2 are disabled. Each of the fourth and eighth driving circuits 340 and 380 may be deactivated even though the write enable signal WT_en is enabled, in the state in which one of the first and second write cancel signals WT_c1 and WT_c2 is enabled. Each of the fourth and eighth driving circuits 340 and 380 may be activated when the third rewrite signal Re_wt3 is enabled, even in the state in which one of the first and second write cancel signals WT_c1 and WT_c2 is enabled.

Figure 2:
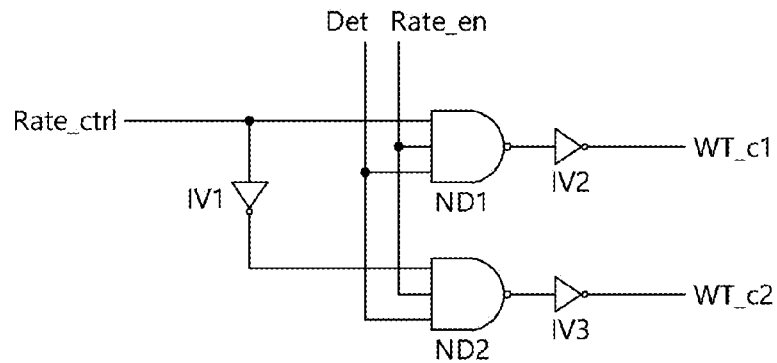
FIG. 2 is a configuration diagram illustrating a representation of an example of a write cancel control circuit shown in FIG. 1.

As shown in FIG. 2, the write cancel control circuit 210 may include first to third inverters IV1, IV2 and IV3, and first and second NAND gates ND1 and ND2. The first inverter IV1 is inputted with the rate control signal Rate_ctrl. The first NAND gate ND1 is inputted with the rate control signal Rate_ctrl, the detection signal Det, and the rate enable signal Rate_en. The second inverter IV2 is inputted with the output signal of the first NAND gate ND1, and outputs the first write cancel signal WT_c1. The second NAND gate ND2 is inputted with the output signal of the first inverter IV1, the detection signal Det, and the rate enable signal Rate_en. The third inverter IV3 is inputted with the output signal of the second NAND gate ND2, and outputs the second write cancel signal WT_c2.

The write cancel control circuit 210 in accordance with an embodiment, configured as mentioned above, enables the first write cancel signal WT_c1 in response to the rate control signal Rate_ctrl, when both the detection signal Det and the rate enable signal Rate_en are enabled. The write cancel control circuit 210 enables the second write cancel signal WT_c2 when the rate control signal Rate_ctrl is disabled in the state in which the detection signal Det and the rate enable signal Rate_en are enabled. The write cancel control circuit 210 disables both the first and second write cancel signals WT_c1 and WT_c2 regardless of the rate control signal Rate_ctrl when even one of the detection signal Det and the rate enable signal Rate_en is disabled.

Figure 3:
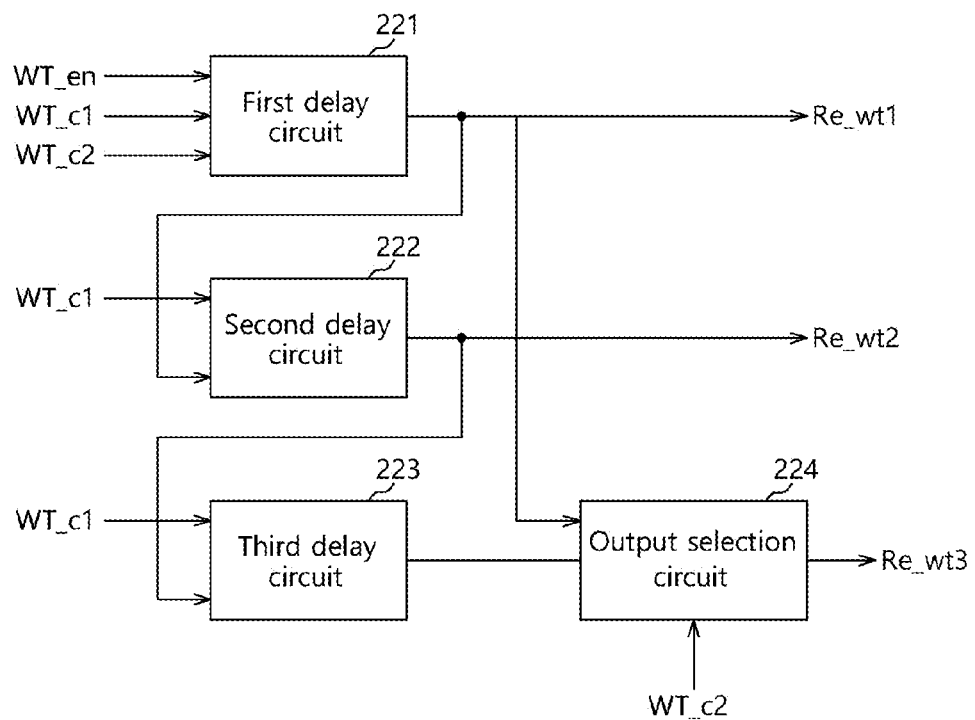
FIG. 3 is a configuration diagram illustrating a representation of an example of a rewrite control circuit shown in FIG. 1.

As shown in FIG. 3, the rewrite control circuit 220 may include first to third delay circuits 221, 222 and 223 and an output selection circuit 224.

The first delay circuit 221 may generate the first rewrite signal Re_wt1 in response to the first and second write cancel signals WT_c1 and WT_c2 and the write enable signal WT_en. For example, the first delay circuit 221 may output the first rewrite signal Re_wt1 by delaying the write enable signal WT_en, when even one of the first and second write cancel signals WT_c1 and WT_c2 is enabled.

The second delay circuit 222 may generate the second rewrite signal Re_wt2 in response to the first write cancel signal WT_c1 and the first rewrite signal Re_wt1. For example, the second delay circuit 222 may output the second rewrite signal Re_wt2 by delaying the first rewrite signal Re_wt1, when the first write cancel signal WT_c1 is enabled.

The third delay circuit 223 may delay the second rewrite signal Re_wt2 and output a resultant signal when the first write cancel signal WT_c1 is enabled.

The output selection circuit 224 may output one of the first rewrite signal Re_wt1 and the output signal of the third delay circuit 223, as the third rewrite signal Re_wt3, in response to the second write cancel signal WT_c2. For example, the output selection circuit 224 may output the output signal of the third delay circuit 223 as the third rewrite signal Re_wt3 when the second write cancel signal WT_c2 is disabled, and output the first rewrite signal Re_wt1 as the third rewrite signal Re_wt3 when the second write cancel signal WT_c2 is enabled.

In the rewrite control circuit 220 in accordance with an embodiment, configured as mentioned above, as shown in FIG. 6A, if the first write cancel signal WT_c1 is enabled and the second write cancel signal WT_c2 is disabled, the first to third delay circuits 221, 222 and 223 may sequentially delay the write enable signal WT_en and sequentially output the first to third rewrite signals Re_wt1, Re_wt2 and Re_wt3. In the rewrite control circuit 220, as shown in FIG. 6B, if the first write cancel signal WT_c1 is disabled and the second write cancel signal WT_c2 is enabled, only the first delay circuit 221 among the first to third delay circuits 221, 222 and 223 may delay the write enable signal WT_en, and the output signal of the first delay circuit 221 may be outputted as the first and third rewrite signals Re_wt1 and Re_wt3.

Figure 4:
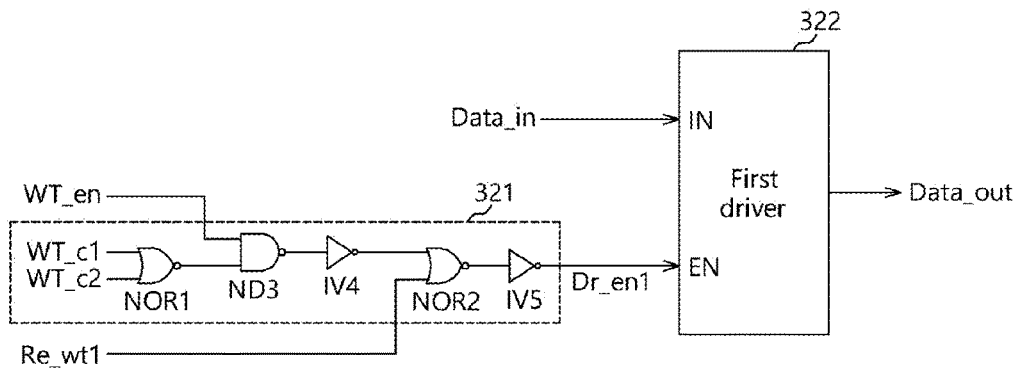
FIG. 4 is a configuration diagram illustrating a representation of an example of a second driving circuit shown in FIG. 1.

As shown in FIG. 4, the second driving circuit 320 may include a first driver enable circuit 321 and a first driver 322.

The first driver enable circuit 321 may generate a first driver enable signal Dr_en1 in response to the first and second write cancel signals WT_c1 and WT_c2, the write enable signal WT_en, and the first rewrite signal Re_wt1. For example, the first driver enable circuit 321 enables the first driver enable signal Dr_en1 when the write enable signal WT_en is enabled, if both the first and second write cancel signals WT_c1 and WT_c2 are disabled. The first driver enable circuit 321 disables the first driver enable signal Dr_en1 even though the write enable signal WT_en is enabled, if even one of the first and second write cancel signals WT_c1 and WT_c2 is enabled. The first driver enable circuit 321 enables the first driver enable signal Dr_en1 when the first rewrite signal Re_wt1 is enabled, in the case where even one of the first and second write cancel signals WT_c1 and WT_c2 is enabled.

The first driver enable circuit 321 may include first and second NOR gates NOR1 and NOR2, a third NAND gate ND3, and fourth and fifth inverters IV4 and IV5. The first NOR gate NOR1 is inputted with the first and second write cancel signals WT_c1 and WT_c2. The third NAND gate ND3 is inputted with the write enable signal WT_en and the output signal of the first NOR gate NOR1. The fourth inverter IV4 is inputted with the output signal of the third NAND gate ND3. The second NOR gate NOR2 is inputted with the output signal of the fourth inverter IV4 and the first rewrite signal Re_wt1. The fifth inverter IV5 is inputted with the output signal of the second NOR gate NOR2, and outputs the first driver enable signal Dr_en1.

The first driver 322 drives inputted data Data_in in response to the first driver enable signal Dr_en1, and outputs driven data Data_out. For example, the first driver 322 drives the inputted data Data_in when the first driver enable signal Dr_en1 is enabled, and outputs the driven data Data_out.

Figure 5:
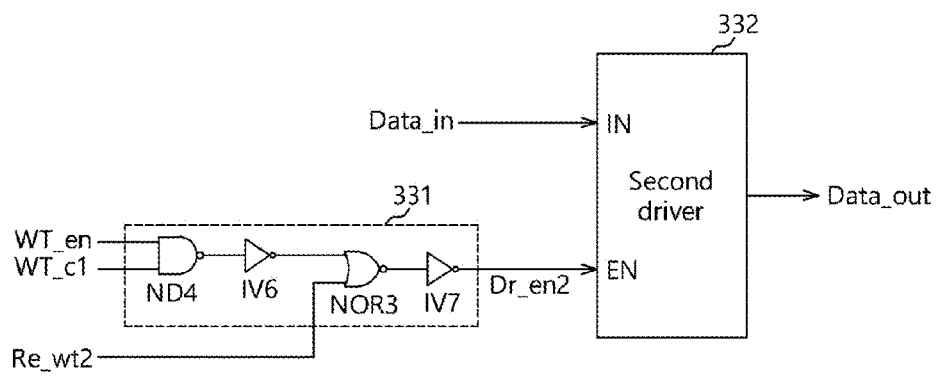
FIG. 5 is a configuration diagram illustrating a representation of an example of a third driving circuit shown in FIG. 1.

As shown in FIG. 5, the third driving circuit 330 may include a second driver enable circuit 331 and a second driver 332.

The second driver enable circuit 331 may generate a second driver enable signal Dr_en2 in response to the first write cancel signal WT_c1, the write enable signal WT_en, and the second rewrite signal Re_wt2. For example, the second driver enable circuit 331 enables the second driver enable signal Dr_en2 when the write enable signal WT_en is enabled, if the first write cancel signal WT_c1 is disabled. The second driver enable circuit 331 disables the second driver enable signal Dr_en2 even though the write enable signal WT_en is enabled, if the first write cancel signal WT_c1 is enabled. The second driver enable circuit 331 enables the second driver enable signal Dr_en2 when the second rewrite signal Re_wt2 is enabled, in the case where the first write cancel signal WT_c1 is enabled.

The second driver enable circuit 331 may include a third NOR gate NOR3, a fourth NAND gate ND4, and sixth and seventh inverters IV6 and IV7. The fourth NAND gate ND4 is inputted with the write enable signal WT_en and the first write cancel signal WT_c1. The sixth inverter IV6 is inputted with the output signal of the fourth NAND gate ND4. The third NOR gate NOR3 is inputted with the output signal of the sixth inverter IV6 and the second rewrite signal Re_wt2. The seventh inverter IV7 is inputted with the output signal of the third NOR gate NOR3, and outputs the second driver enable signal Dr_en2.

The second driver 332 drives inputted data Data_in in response to the second driver enable signal Dr_en2, and outputs driven data Data_out. For example, the second driver 332 drives the inputted data Data_in when the second driver enable signal Dr_en2 is enabled, and outputs the driven data Data_out.

The first driving circuit 310 and the fifth driving circuit 350 which are activated when the write enable signal WT_en is enabled may be configured in the same manner with the exception that only the designations of input and output signals thereof are different.

The fourth driving circuit 340, the sixth driving circuit 360 and the eighth driving circuit 380 may be configured in the same manner as the second driving circuit 320 with the exception that only the designations of input and output signals thereof are different.

The seventh driving circuit 370 may be configured in the same manner as the third driving circuit 330 with the exception that only the designations of input and output signals thereof are different.

The operation of the semiconductor memory apparatus in accordance with the embodiment, configured as mentioned above, will be described below.

First, descriptions will be made for an operation in which all driving circuits are simultaneously activated by, for example, the write control circuit 400 and data is transferred to a data storage region in a write operation.

The write cancel control circuit 210 disables both the first and second write cancel signals WT_c1 and WT_c2 when even one of the rate enable signal Rate_en and the detection signal Det is disabled.

The rewrite control circuit 220 disables all of the first to third rewrite signals Re_wt1, Re_wt2 and Re_wt3 when both the first and second write cancel signals WT_c1 and WT_c2 are disabled. Thus, the write control circuit 200, may disable at least one write cancel signal WT_c1 and WT_c2 and at least one rewrite signal Re_wt1, Re_wt2, and Re_wt3 when the detection signal Det is disabled.

All of the first to eighth driving circuits 310, 320, 330, 340, 350, 360, 370 and 380 are activated when the write enable signal WT_en is enabled, if all of the first and second write cancel signals WT_c1 and WT_c2 and the first to third rewrite signals Re_wt1, Re_wt2 and Re_wt3 are disabled. The activated first to eighth driving circuits 310, 320, 330, 340, 350, 360, 370 and 380 drive data, and transfer the driven data to the data storage region 400.

Summarizing these, in the write operation, the case where all the driving circuits 310, 320, 330, 340, 350, 360, 370 and 380 are simultaneously activated and perform driving operations corresponds to the case where even one of the rate enable signal Rate_en and the detection signal Det is enabled. That is to say, even in any case, the case where all the driving circuits 310, 320, 330, 340, 350, 360, 370 and 380 are simultaneously activated by the write control circuit 200 in response to the write enable signal WT_en and perform driving operations corresponds to the case where the rate enable signal Rate_en is disabled to allow all the driving circuits 310, 320, 330, 340, 350, 360, 370 and 380 to operate simultaneously or the case where the detection signal Det is disabled, that is, the write voltage V_wt used in writing is higher than the target level to perform a normal write operation. In one example, the write control circuit 200 may control the driving circuits 310, 320, 330, 340, 350, 360, 370, and 380 to be simultaneously activated regardless of the rate control signal Rate_ctrl when the rate enable signal Rate_en is disabled.

Second, descriptions will be made for an operation in which some of the first to eighth driving circuits 310, 320, 330, 340, 350, 360, 370 and 380 are activated and operate first, and the remainder are activated and operate thereafter, in response to the write enable signal WT_en, the rate control signal Rate_ctrl, the rate enable signal Rate_en, and the detection signal Det. This corresponds to the case where the rate enable signal Rate_en is enabled and the detection signal Det is enabled with the write voltage V_wt lower than the target level. In this regard, the semiconductor memory apparatus in accordance with the embodiment discloses a technology that the first to eighth driving circuits 310, 320, 330, 340, 350, 360, 370 and 380 are sequentially activated by the unit of a pair of driving circuits or one half of the first to eighth driving circuits 310, 320, 330, 340, 350, 360, 370 and 380 is activated first and the other half of the first to eighth driving circuits 310, 320, 330, 340, 350, 360, 370 and 380 is activated thereafter. However, it is to be noted that the number of driving circuits to be activated first is not limited specifically.

The semiconductor memory apparatus in accordance with the embodiment may be configured such that, if the rate control signal Rate_ctrl is enabled in the state in which both the rate enable signal Rate_en and the detection signal Det are enabled, the first write cancel signal WT_c1 of the first and second write cancel signals WT_c1 and WT_c2 is enabled and pairs of driving circuits are sequentially activated.

In detail, if the rate control signal Rate_ctrl is enabled in the state in which both the rate enable signal Rate_en and the detection signal Det are enabled, the write cancel control circuit 210 enables the first write cancel signal WT_c1 of the first and second write cancel signals WT_c1 and WT_c2.

Figure 6A:
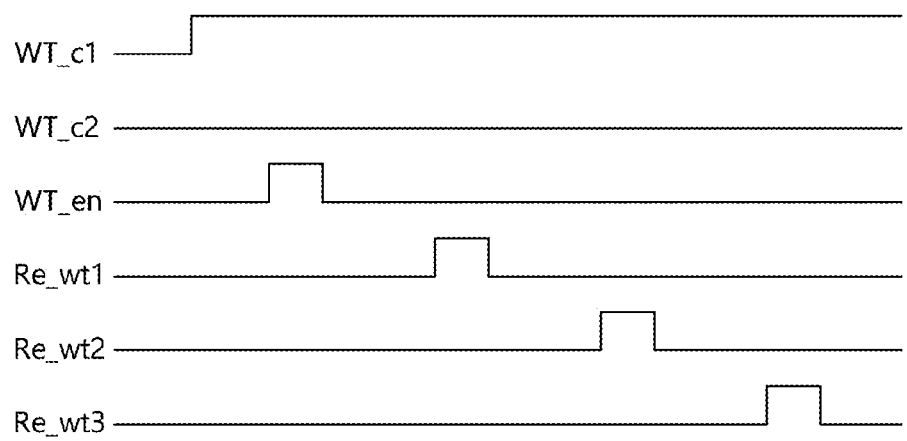
FIGS. 6A and 6B are a representation of an example of a timing diagram to assist in an explanation of operation of the semiconductor memory apparatus in accordance with an embodiment.
Figure 6B:
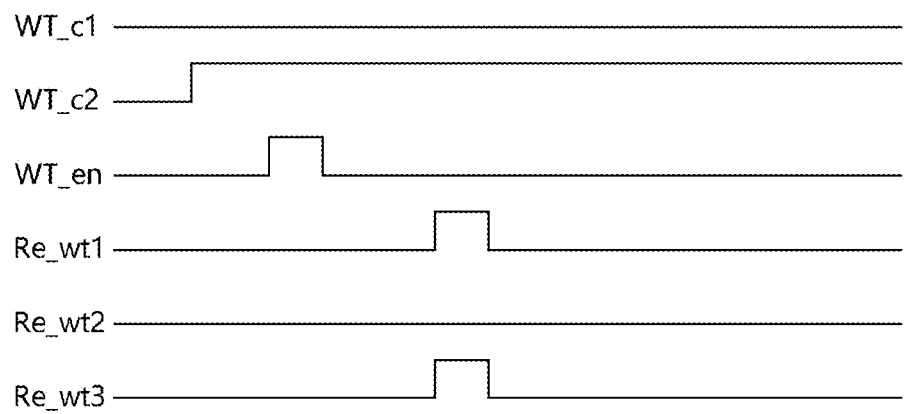

The rewrite control circuit 220 sequentially enables the first to third rewrite signals Re_wt1, Re_wt2 and Re_wt3 by delaying the write enable signal WT_en, when the first write cancel signal WT_c1 is enabled, as in FIG. 6A. In other words, the write control circuit 200 may enable at least one rewrite signal Re_wt1, Re_wt2, and Re_wt3 after at least one of the write cancel signals WT_c1 and WT_c2 is enabled, when the detection signal Det is enabled.

The first and fifth driving circuits 310 and 350 which are controlled by only the write enable signal WT_en are activated when the write enable signal WT_en is enabled, drive data, and transfer the driven data to the data storage region 400.

The second to fourth driving circuits 320, 330 and 340 and the sixth to eighth driving circuits 360, 370 and 380 which are controlled by the first write cancel signal WT_c1 are deactivated due to the first write cancel signal WT_c1 which is enabled, even though the write enable signal WT_en is enabled.

The second and sixth driving circuits 320 and 360 which are deactivated due to the enabled first write cancel signal WT_c1 are activated again in response to the first rewrite signal Re_wt1 which is generated by delaying the write enable signal WT_en. The activated second and sixth driving circuits 320 and 360 drive data, and transfer the driven data to the data storage region 400.

The third and seventh driving circuits 330 and 370 which are deactivated due to the enabled first write cancel signal WT_c1 are activated again in response to the second rewrite signal Re_wt2 which is generated by delaying the first rewrite signal Re_wt1. The activated third and seventh driving circuits 330 and 370 drive data, and transfer the driven data to the data storage region 400.

The fourth and eighth driving circuits 340 and 380 which are deactivated due to the enabled first write cancel signal WT_c1 are activated again in response to the third rewrite signal Re_wt3 which is generated by delaying the second rewrite signal Re_wt2. The activated fourth and eighth driving circuits 340 and 380 drive data, and transfer the driven data to the data storage region 400.

Summarizing these, the write control circuit 200 of the semiconductor memory apparatus in accordance with an embodiment may sequentially activate pairs of driving circuits and sequentially transfer data to the data storage region 400, if the rate control signal Rate_ctrl is enabled in the case where the rate enable signal Rate_en is enabled and the detection signal Det is enabled. In other words, the semiconductor memory apparatus in accordance with an embodiment may sequentially activate pairs of driving circuits and sequentially transfer data to the data storage region 400, if the write voltage V_wt becomes lower than the target level in the state in which the rate enable signal Rate_en and the rate control signal Rate_ctrl are enabled, in a write operation. Further still, the write control circuit 200 may enable at least one write cancel signal WT_c1 and WT_c2 when the write voltage V_wt becomes lower than the target level, and the write control circuit 200 may generate at least one rewrite signal Re_wt1, Re_wt2, and Re_wt3 after the write voltage V_wt becomes lower than the target level.

The write control circuit 200 of the semiconductor memory apparatus in accordance with an embodiment may be configured such that, if the rate control signal Rate_ctrl is disabled in the state in which both the rate enable signal Rate_en and the detection signal Det are enabled, the second write cancel signal WT_c2 of the first and second write cancel signals WT_c1 and WT_c2 is enabled, and one half of the driving circuits are activated first and the other half of the driving circuits are activated thereafter.

In detail, if the rate control signal Rate_ctrl is disabled in the state in which both the rate enable signal Rate_en and the detection signal Det are enabled, the write cancel control circuit 210 enables the second write cancel signal WT_c2 of the first and second write cancel signals WT_c1 and WT_c2.

The rewrite control circuit 220 simultaneously enables the first and third rewrite signals Re_wt1 and Re_wt3 by delaying the write enable signal WT_en, when the second write cancel signal WT_c2 is enabled, as in FIG. 6B.

The second driving circuit 320, the fourth driving circuit 340, the sixth driving circuit 360, and the eight driving circuit 380 are inputted with the enabled second write cancel signal WT_c2, and are deactivated even though the write enable signal WT_en is enabled.

The first and fifth driving circuits 310 and 350 which are controlled by only the write enable signal WT_en and the third and seventh driving circuits 330 and 370 which are not controlled by the second write cancel signal WT_c2 are activated when the write enable signal WT_en is enabled, drive data, and transfer the driven data to the data storage region 400.

The second driving circuit 320 and the sixth driving circuit 360 which are deactivated due to the enabled second write cancel signal WT_c2 even though the write enable signal WT_en is enabled are activated in response to the first rewrite signal Re_wt1 which is generated by delaying the write enable signal WT_en. The activated second and sixth driving circuits 320 and 360 drive data, and transfer the driven data to the data storage region 400.

The fourth driving circuit 340 and the eighth driving circuit 380 which are deactivated due to the enabled second write cancel signal WT_c2 even though the write enable signal WT_en is enabled are activated in response to the third rewrite signal Re_wt3 which is generated by delaying the write enable signal WT_en. The activated fourth and eighth driving circuits 340 and 380 drive data, and transfer the driven data to the data storage region 400. Because the first and third rewrite signals Re_wt1 and Re_wt3 are signals which are enabled simultaneously, the second driving circuit 320, the fourth driving circuit 340, the sixth driving circuit 360, and the eighth driving circuit 380 are simultaneously activated.

Summarizing these, the write control circuit 200 of the semiconductor memory apparatus in accordance with the embodiment may activate simultaneously one half of the driving circuits 310, 330, 350 and 370 and transfer data to the data storage region 400, and activate thereafter the other half of the driving circuits 320, 340, 360 and 380 and transfer data to the data storage region 400, if the rate control signal Rate_ctrl is disabled in the case where the rate enable signal Rate_en is enabled and the detection signal Det is enabled. In other words, the semiconductor memory apparatus in accordance with an embodiment may activate simultaneously one half of the driving circuits and transfer data to the data storage region 400, and then activate the other half of the driving circuits and transfer data to the data storage region 400, if the write voltage V_wt becomes lower than the target level in the state in which the rate enable signal Rate_en and the rate control signal Rate_ctrl are enabled, in a write operation.

As is apparent from the above descriptions, the semiconductor memory apparatus in accordance with the embodiment may be configured in such a manner that, if the voltage level of the voltage used in a write operation is lower than a target level, some of a plurality of driving circuits are activated first and the remainder are activated thereafter, whereby data may be transferred normally to a data storage region.

While various embodiments have been described above, it will be understood by those skilled in the art that the embodiments described are examples only. Accordingly, the semiconductor memory apparatus described herein should not be limited based on the described embodiments.

What is claimed is:

1. A semiconductor memory apparatus comprising:
a plurality of driving circuits suitable for being applied with a write voltage and transferring data to a data storage region;
a write voltage detection circuit suitable for detecting a voltage level of the write voltage and generating a detection signal; and
a write control circuit suitable for performing an operation in a first mode that activates all of the plurality of driving circuits and a second mode that first activate some of the plurality of driving circuits and activate remaining driving circuits after activating the some of the plurality of driving circuits, in response to a write enable signal, a rate control signal for controlling the operation, a rate enable signal for enabling the operation, and the detection signal,
wherein the write control circuit performs in one of the first and second modes,
wherein the rate control signal and the rate enable signal are generated from a mode register set, and
wherein the write enable signal, the rate control signal, the rate enable signal, and the detection signal are received by the write control circuit.

2. The semiconductor memory apparatus according to claim 1, wherein each of the plurality of the driving circuits is activated in response to a write cancel signal, a rewrite signal that the write enable signal is delayed and the write enable signal.

3. The semiconductor memory apparatus according to claim 2, wherein each of the plurality of the driving circuits is activated in response to the write enable signal when the write cancel signal is disabled, is deactivated even though the write enable signal is enabled when the write cancel signal is enabled, and is activated again when the rewrite signal for activating the deactivated driving circuit is enabled even though the write cancel signal is enabled.

4. The semiconductor memory apparatus according to claim 1, wherein the write voltage detection circuit enables the detection signal when the voltage level of the write voltage becomes lower than a target level.

5. The semiconductor memory apparatus according to claim 1, wherein the write control circuit activates the plurality of driving circuits in response to the write enable signal when even one of the rate enable signal and the detection signal is disabled, and activates one half earlier than the other half of the plurality of driving circuits and activates the other half after activating the one half, when the rate enable signal is enabled and the rate control signal is disabled.

6. The semiconductor memory apparatus according to claim 5, wherein the write control circuit controls the plurality of driving circuits to be simultaneously activated, regardless of the rate control signal, when the rate enable signal is disabled, controls the plurality of driving circuits to be sequentially activated, when the rate enable signal is enabled and the rate control signal is enabled, and controls one half of the plurality of driving circuits to be activated earlier than the other half and the other half to be activated after activating the one half, when the rate enable signal is enabled and the rate control signal is disabled.

7. The semiconductor memory apparatus according to claim 6, wherein the write control circuit generates a first write cancel signal and a second write cancel signal for activating the plurality of driving circuits and a first rewrite signal, a second rewrite signal and a third rewrite signal that the write enable signal is sequentially delayed in response to the detection signal, the rate control signal, the rate enable signal and the write enable signal.

8. The semiconductor memory apparatus according to claim 7, wherein the write control circuit comprises:
   a write cancel control circuit suitable for disabling both the first and second write cancel signals when even one of the rate enable signal and the detection signal is disabled, and enabling one of the first and second write cancel signals in response to the rate control signal when both the rate enable signal and the detection signal are enabled; and
   a rewrite control circuit suitable for sequentially enabling the first to third rewrite signals or enabling some of the first to third rewrite signals, in response to the first and second write cancel signals and the write enable signal.

9. The semiconductor memory apparatus according to claim 8,
   wherein some of the plurality of driving circuits are activated when the write enable signal is enabled, and
   wherein remaining driving circuits except the some among the plurality of driving circuits are activated in response to the write enable signal when the first and second write cancel signals are disabled, are deactivated even though the write enable signal is enabled, when even one of the first and second write cancel signals is enabled, and are activated again when one of the first to third rewrite signals for activating the deactivated remaining driving circuits again is enabled, even though the first and second write cancel signals are enabled.

10. The semiconductor memory apparatus according to claim 1, wherein the write voltage is a driving voltage applied to the plurality of driving circuits.

* * * * *